(12) United States Patent
Dahilig et al.

(10) Patent No.: US 8,022,539 B2
(45) Date of Patent: Sep. 20, 2011

(54) INTEGRATED CIRCUIT PACKAGING SYSTEM WITH INCREASED CONNECTIVITY AND METHOD OF MANUFACTURE THEREOF

(75) Inventors: Frederick Rodriguez Dahilig, Singapore (SG); Zigmund Ramirez Camacho, Singapore (SG); Henry Descalzo Bathan, Singapore (SG); Lionel Chien Hui Tay, Singapore (SG)

(73) Assignee: Stats Chippac Ltd., Singapore (SG)

( * ) Notice: Subject to any disclaimer, the term of this patent is extended or adjusted under 35 U.S.C. 154(b) by 225 days.

(21) Appl. No.: 12/272,765

(22) Filed: Nov. 17, 2008

(65) Prior Publication Data

US 2010/0123227 A1    May 20, 2010

(51) Int. Cl.
*H01L 23/04* (2006.01)
(52) U.S. Cl. ............... 257/730; 257/E23.004; 257/675; 257/692; 438/117
(58) Field of Classification Search ........... 257/E21.499, 257/E23.001, 675, 666, 676, 678, 685, 686, 257/734, 777, 778, E23.004, 692, 730; 438/123, 438/117
See application file for complete search history.

(56) References Cited

U.S. PATENT DOCUMENTS

| | | | |
|---|---|---|---|
| 5,677,566 A | 10/1997 | King et al. | |
| 5,866,939 A * | 2/1999 | Shin et al. | 257/666 |
| 6,077,724 A * | 6/2000 | Chen | 438/107 |
| 6,157,080 A * | 12/2000 | Tamaki et al. | 257/738 |
| 6,229,217 B1 * | 5/2001 | Fukui et al. | 257/777 |
| 6,294,838 B1 * | 9/2001 | Peng | 257/777 |
| 6,297,543 B1 | 10/2001 | Hong et al. | |
| 6,316,822 B1 | 11/2001 | Venkateshwaran et al. | |
| 6,353,263 B1 * | 3/2002 | Dotta et al. | 257/777 |
| 6,611,048 B1 | 8/2003 | Fazelpour et al. | |
| 6,621,172 B2 * | 9/2003 | Nakayama et al. | 257/787 |
| 6,764,880 B2 * | 7/2004 | Wu et al. | 438/123 |
| 6,777,796 B2 * | 8/2004 | Fujimoto et al. | 257/686 |
| 6,784,529 B2 * | 8/2004 | Fukuda et al. | 257/686 |
| 6,818,973 B1 | 11/2004 | Foster | |
| 6,870,249 B2 * | 3/2005 | Egawa | 257/686 |
| 6,876,068 B1 | 4/2005 | Lee et al. | |
| 6,927,478 B2 * | 8/2005 | Paek | 257/666 |
| 6,943,061 B1 | 9/2005 | Sirinorakul et al. | |
| 7,042,073 B2 * | 5/2006 | Kado et al. | 257/678 |
| 7,049,177 B1 | 5/2006 | Fan et al. | |
| 7,087,455 B2 * | 8/2006 | Fukuda et al. | 438/106 |
| 7,125,745 B2 * | 10/2006 | Chen et al. | 438/108 |
| 7,161,232 B1 | 1/2007 | Lee et al. | |
| 7,190,059 B2 * | 3/2007 | Hagen et al. | 257/686 |
| 7,193,298 B2 | 3/2007 | Hong et al. | |
| 7,211,471 B1 | 5/2007 | Foster | |
| 7,221,041 B2 * | 5/2007 | Lin et al. | 257/666 |
| 7,253,025 B2 * | 8/2007 | Jiang et al. | 438/109 |
| 7,253,529 B2 | 8/2007 | Tao et al. | |
| 7,291,869 B2 * | 11/2007 | Otremba | 257/107 |
| 7,309,923 B2 * | 12/2007 | Kee | 257/777 |
| 7,312,105 B2 * | 12/2007 | Huang et al. | 438/108 |

(Continued)

*Primary Examiner* — Chris Chu
(74) *Attorney, Agent, or Firm* — Mikio Ishimaru (57) ABSTRACT

A method of manufacture of an integrated circuit packaging system includes: forming a lead frame having contact pads and connection leads; coupling a base integrated circuit to the contact pads; coupling a chip interconnect between the base integrated circuit, the connection leads, the contact pads, or a combination thereof; molding a package body on the connection leads, the base integrated circuit, and the chip interconnects, including having the contact pads exposed; and forming a bottom surface on the package body including forming the connection leads to be coplanar with the bottom surface.

7 Claims, 8 Drawing Sheets

U.S. PATENT DOCUMENTS

| | | | |
|---|---|---|---|
| 7,315,078 B2 * | 1/2008 | Huang | 257/686 |
| 7,384,819 B2 | 6/2008 | Yip et al. | |
| 7,521,288 B2 * | 4/2009 | Arai et al. | 438/109 |
| 7,598,603 B2 * | 10/2009 | Otremba | 257/675 |
| 7,645,640 B2 * | 1/2010 | Lee et al. | 438/124 |
| 2008/0017994 A1 | 1/2008 | Do et al. | |
| 2008/0179729 A1 | 7/2008 | Shim et al. | |
| 2009/0072366 A1 | 3/2009 | Badakere Govindaiah et al. | |

* cited by examiner

FIG. 17

INTEGRATED CIRCUIT PACKAGING SYSTEM WITH INCREASED CONNECTIVITY AND METHOD OF MANUFACTURE THEREOF

TECHNICAL FIELD

The present invention relates generally to an integrated circuit packaging system, and more particularly to a system for packaging multiple integrated circuits in a leaded package.

BACKGROUND ART

Many of today's highly integrated products have become exceedingly popular. These products include cell phones that include a camera, or a global positioning system that includes an audio player for personal music downloads. In order to integrate these diverse functions quickly, the electronics industry has pushed the boundaries of package technology in many directions.

Integrated circuit dice are conventionally enclosed in plastic packages that provide protection from hostile environments and enable electrical interconnection between the integrated circuit die and an underlying substrate such as a printed circuit board (PCB). The elements of such a package include a conductive lead frame, an integrated circuit die, bonding material to attach the integrated circuit die to the lead frame, bond wires which electrically connect pads on the integrated circuit die to individual leads of the lead frame, and a hard plastic encapsulant material which covers the other components and forms the exterior of the package.

The lead frame is the central supporting structure of such a package. A portion of the lead frame is internal to the package, i.e., completely surrounded by the plastic encapsulant. Portions of the leads of the lead frame extend externally from the package or are partially exposed within the encapsulant material for use in electrically connecting the package to another component. In certain semiconductor packages, a portion of the die pad of the lead frame also remains exposed within the exterior of the package for use as a heat sink.

One type of semiconductor package commonly known in the electronics field is referred to as a quad flat pack (QFP) package. A typical QFP package comprises a thin, generally square package body defining four peripheral sides of substantially equal length. Protruding from each of the four peripheral sides of the package body are a number of leads which each have a generally gull-wing configuration. Portions of the leads are internal to the package body, and are electrically connected to respective ones of the pads or terminals of a semiconductor die also encapsulated within the package body. The semiconductor die is itself mounted to a die pad of the QFP package lead frame.

There is a current need in the electronics industry for a QFP package which includes additional input/output capabilities than can be provided by the leads protruding from the sides of the package body. Thus, a need still remains for an integrated circuit packaging system with increased connectivity that can provide additional connection options for highly integrated electronic packages while maintaining a thin profile. In view of the rapid development of products that require high levels of integration, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to save costs, improve efficiencies and performance, and meet competitive pressures, adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: forming a lead frame having contact pads and connection leads; coupling a base integrated circuit to the contact pads; coupling a chip interconnect between the base integrated circuit, the connection leads, the contact pads, or a combination thereof; molding a package body, on the lead frame, the base integrated circuit, and the chip interconnects, includes having the contact pads exposed; and forming a bottom surface on the package body including forming the connection leads to be coplanar with the bottom surface.

The present invention provides an integrated circuit packaging system includes a package body having contact pads and connection leads exposed; a base integrated circuit coupled to the contact pads; chip interconnects between the base integrated circuit, the connection leads, the contact pads, or a combination thereof; and a bottom surface on the package body with the connection leads formed coplanar to the bottom surface.

Certain embodiments of the invention have other aspects in addition to or in place of those mentioned above. The aspects will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that process or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail. Likewise, the drawings showing embodiments of the system are semi-diagrammatic and not to scale and, particularly, some of the dimensions are for the clarity of presentation and are shown greatly exaggerated in the drawing FIGs. Where multiple embodiments are disclosed and described, having some features in common, for clarity and ease of illustration, description, and comprehension thereof, similar and like features one to another will ordinarily be described with like reference numerals.

For expository purposes, the term "horizontal" as used herein is defined as a plane parallel to the plane or surface of the integrated circuit die, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane. The term "on" means there is direct contact among elements. The term "processing" as used herein includes stamping, forging, patterning, exposure, development, etching, cleaning, and/or removal of the material or laser trimming as required in forming a described structure.

Figure 1:
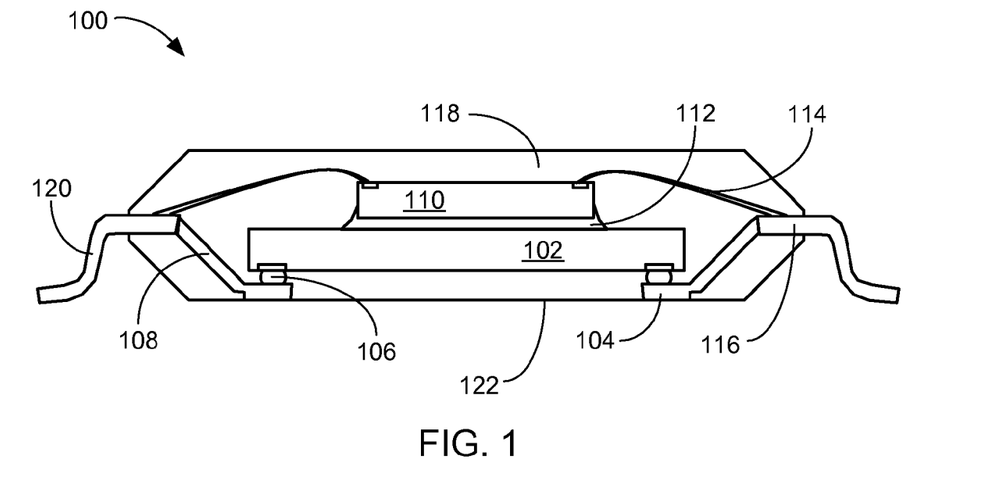
FIG. 1 is a cross-sectional view of an integrated circuit packaging system with increased connectivity, as viewed along the section line 1-1 of FIG. 3, in an embodiment of the present invention.
Figure 3:
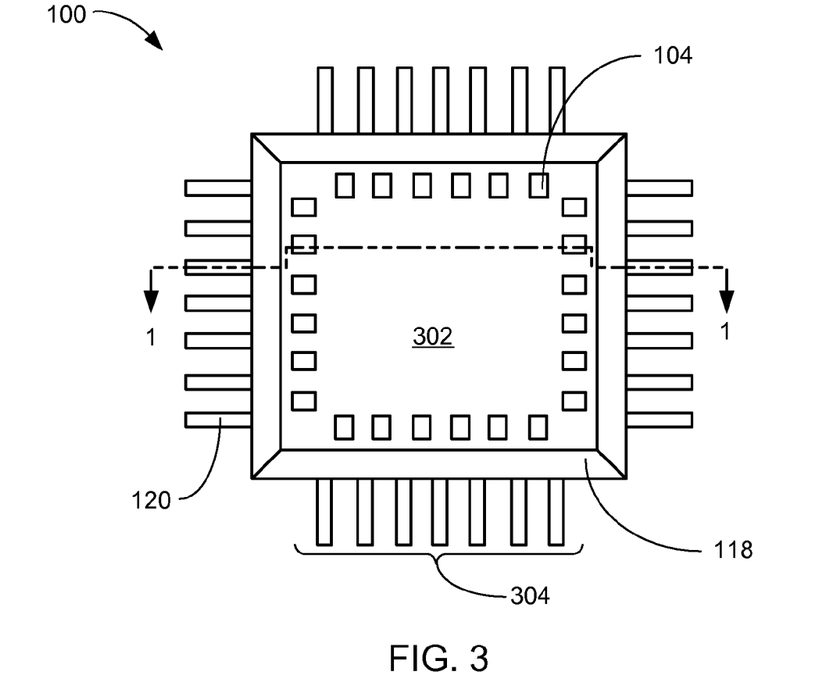
FIG. 3 is a bottom view of the integrated circuit packaging system of FIG. 1.

Referring now to FIG. 1, therein is shown a cross-sectional view of an integrated circuit packaging system 100 with increased connectivity, as viewed along the section line 1-1 of FIG. 3, in an embodiment of the present invention. The cross-sectional view of the integrated circuit packaging system 100 depicts a base integrated circuit 102 coupled to contact pads 104 by chip interconnects 106, such as bond wires, solder balls, solder bumps, solder columns, or stud bumps. The contact pads 104 may extend from a tie bar 108 that may elevate to a level near that of the inactive side of the base integrated circuit 102, such as a flip chip integrated circuit.

A wire bond integrated circuit 110 may be attached to the inactive side of the base integrated circuit 102 by an adhesive 112, such as a die attach material. Electrical interconnects 114, such as bond wires, may couple the wire bond integrated circuit 110 to a bond finger 116, the tie bar 108, or a combination thereof.

A package body 118 may be formed on the base integrated circuit 102, the chip interconnects 106, the wire bond integrated circuit 110, the electrical interconnects 114, the tie bars 108, the bond fingers 116, and the contact pads 104. The package body 118 may be formed by injecting an epoxy molding compound that leaves a portion of the contact pads 104 exposed on the bottom surface.

Connection leads 120 may extend from the bond finger 116, beyond the package body 118, and are bent to be coplanar with a bottom surface 122 of the package body. The connection leads 120 may be formed so that they are coplanar with the exposed portion of the contact pads 104 and the bottom surface 122 of the package body 118.

It has been discovered that the integrated circuit packaging system 100 may provide a significantly increased input/output capacity, multiple chip integration, and ease of assembly, without increasing the thickness of the package. This aspect can assist in the integration of dissimilar technologies such as memory and sequential logic integrated circuits.

Figure 2:
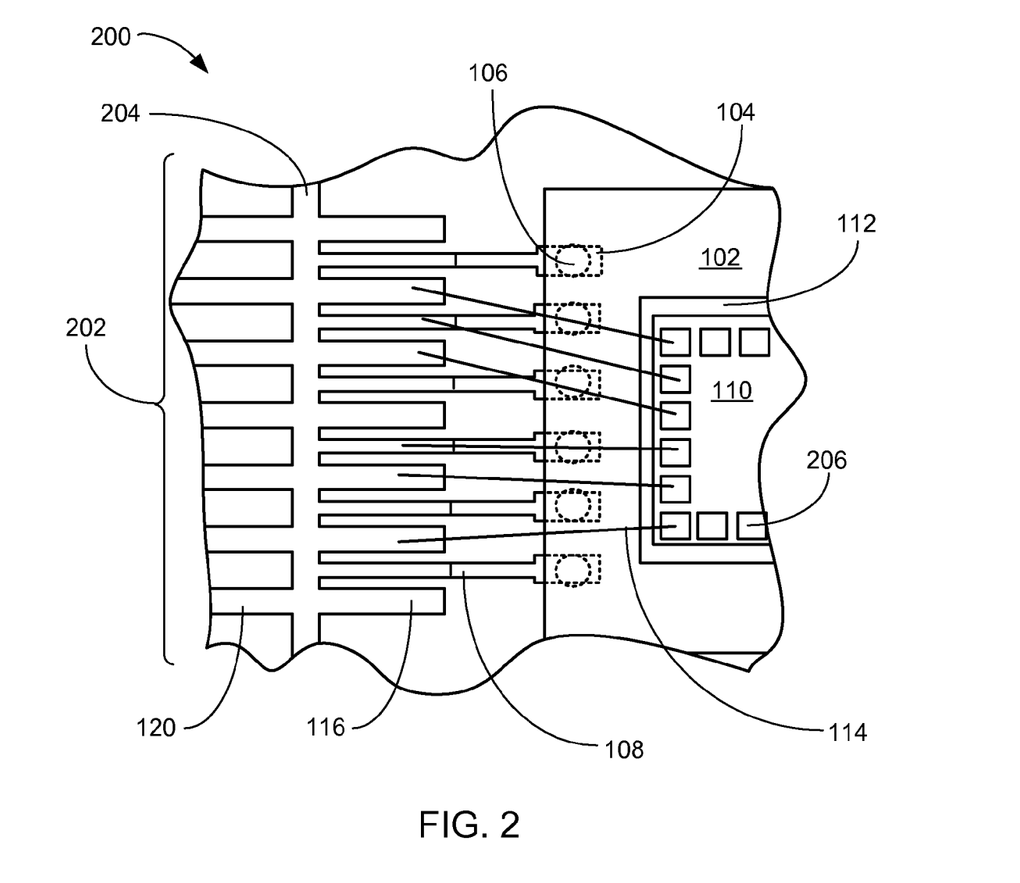
FIG. 2 is a top plan view of a lead frame assembly segment for implementing the integrated circuit packaging system of the present invention.

Referring now to FIG. 2, therein is shown a top plan view of a lead frame assembly 200 segment for implementing the integrated circuit packaging system of the present invention. The top plan view of the lead frame assembly 200 depicts a lead frame 202, having a dam bar 204 that joins the connection leads 120, the bond fingers 116, and the tie bars 108 prior to molding the package body 118, of FIG. 1.

The base integrated circuit 102 may be positioned over the contact pads 104 and coupled by the chip interconnects 106. The wire bond integrated circuit 110 is attached to the base integrated circuit 102 by the adhesive 112. While the wire bond integrated circuit 110 is shown to be smaller than the base integrated circuit 102, this is an example only and the actual size of the wire bond integrated circuit 110 may differ.

The electrical interconnects 114 are shown coupled between a bonding pad 206 and the bond finger 116 or the tie bar 108. This is also by way of an example and the bonding pad 206 may be coupled to the bond finger 116, the tie bar 108, or the combination thereof. By coupling the bonding pad 206 to the tie bar 108, a signal may be shared between the base integrated circuit 102 and the wire bond integrated circuit 110 without the addition of interconnects outside the package body 118.

The dam bar 204 may provide a sealing surface during the formation of the package body 118, of FIG. 1. The dam bar 204 may be removed, in a subsequent manufacturing step, once the package body 118 is formed to hold the tie bars 108 and the bond fingers 116 in place.

Referring now to FIG. 3, therein is shown a bottom view of the integrated circuit packaging system 100 of FIG. 1. The bottom view of the integrated circuit packaging system 100 depicts the contact pads 104 positioned around a package bottom 302 of the package body 118. The number and position of the contact pads 104 is an example only and the actual number and position may differ. While the package body 118 is shown having sloped edges on the package bottom 302, this is an example only.

The connection leads 120 may be distributed along a package side 304. The number of the connection leads 120 on the package side 304 may be equal for each of the sides. This configuration matches the definition of an industry standard quad flat pack (QFP) package. The number and position of the connection leads 120 formed on the package side 304 is an example only and the actual position and number may differ as long as all of the package sides 304 are the same. The section line 1-1 shows the position and viewing direction of the cross-sectional view of FIG. 1.

Prior to forming the shape of the connection leads 120, they extend straight out of the package side 304. In the first embodiment of the present invention, the connection leads 120 are bent so to provide a coplanar connection surface between the contact pads 104 and the connection leads 120, but other configurations are possible.

Figure 4:
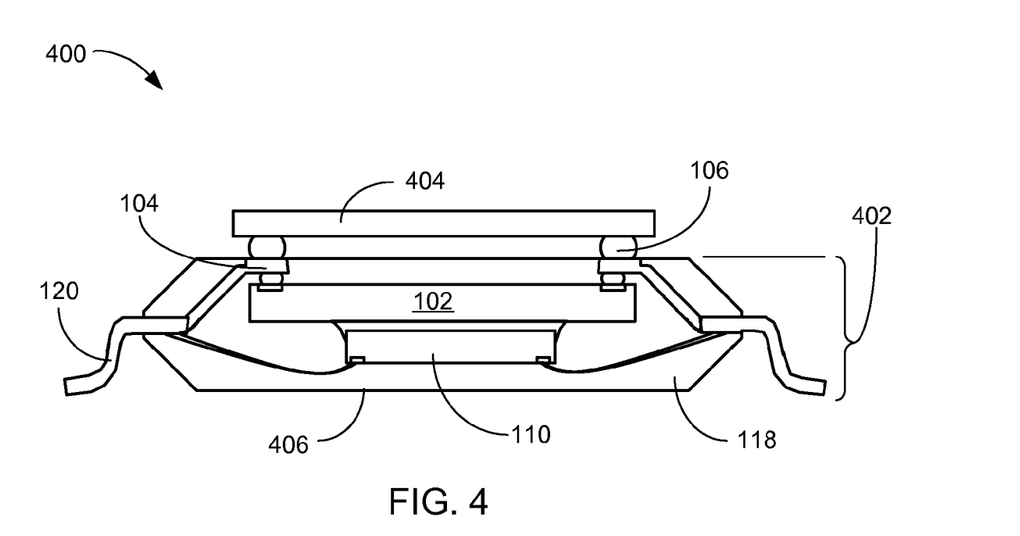
FIG. 4 is a cross-sectional view, substantially similar to FIG. 1, of a package stack application using an alternative embodiment of the integrated circuit packaging system.

Referring now to FIG. 4, therein is shown a cross-sectional view, substantially similar to FIG. 1, of a package stack 400 application using an alternative embodiment 402 of the integrated circuit packaging system 100, of FIG. 1. The cross-sectional view of the package stack 400 depicts the alternative embodiment 402, having the connection leads 120 bent away from the plane of the contact pads 104. The connection leads 120 may be coplanar with a bottom surface 406 of the package body 118.

An external integrated circuit package 404 may be coupled to the contact pads 104 by the chip interconnects 106. The external integrated circuit package 404 may be a ball grid array, a wafer level chip scale package, a quad flat pack, a quad flat pack—no lead (QFN), or other leaded chip carrier. This configuration provides electrical connections between the connection leads 120, the base integrated circuit 102, the wire bond integrated circuit 110, the external integrated circuit package 404, or a combination thereof.

Figure 5:
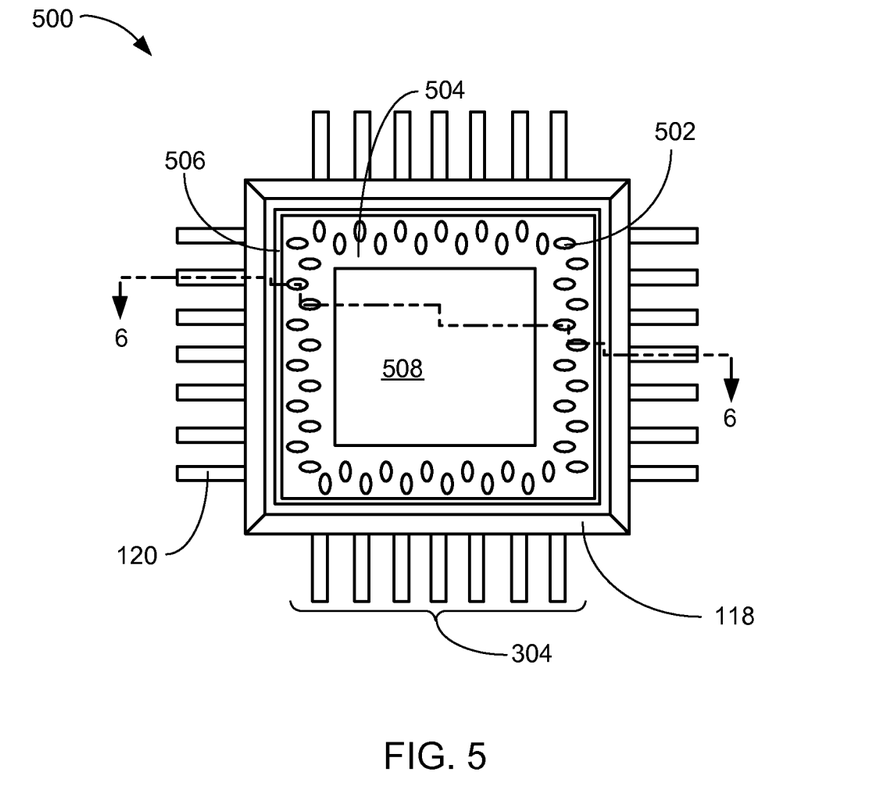
FIG. 5 is a bottom view of an integrated circuit packaging system, in a second alternative embodiment of the present invention

Referring now to FIG. 5, therein is shown a bottom view of an integrated circuit packaging system 500, in a second alternative embodiment of the present invention including a section line 6-6. The bottom view of the integrated circuit packaging system 500 depicts the package body 118 having the connection leads 120 extending from the package side 304.

Contact pads 502 may be formed on a package bottom 504 in a double row configuration. A saw line 506 may be etched, by a singulating saw or laser, in order to isolate the contact pads 502 from a lead frame (not shown). A heat spreader 508 may optionally be embedded in the package bottom 504. The section line 6-6 indicates the position and direction of view of the cross-section of FIG. 6.

Figure 6:
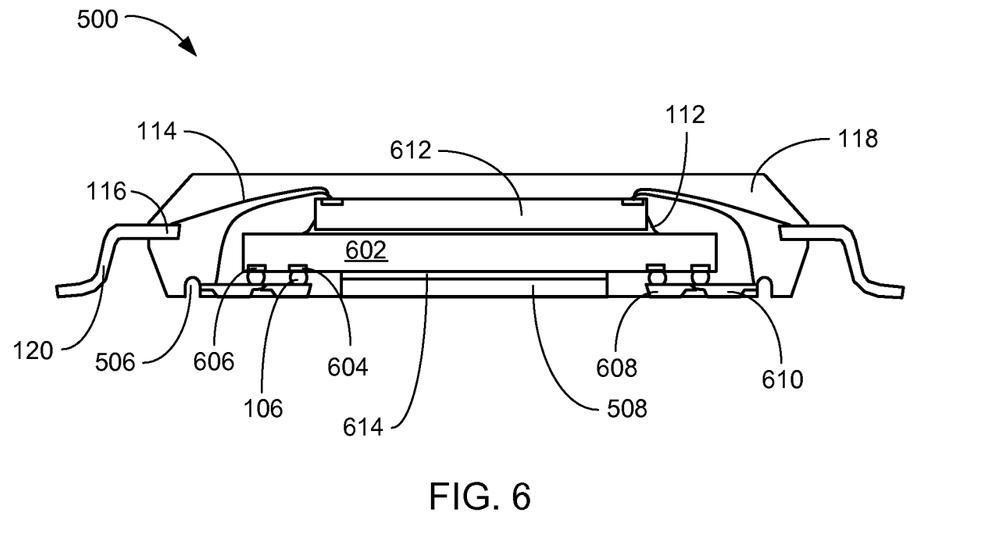
FIG. 6 is a cross-sectional view of the integrated circuit packaging system, along a section line 6-6, of FIG. 5.

Referring now to FIG. 6, therein is shown a cross-sectional view of the integrated circuit packaging system 500, along a section line 6-6, of FIG. 5. The cross-sectional view of the integrated circuit packaging system 500 depicts a base integrated circuit 602, such as a flip chip integrated circuit, having inner pads 604 and outer pads 606. The chip interconnects 106 may couple the inner pads 604 to inner contact pads 608 and the outer pads 606 to outer contact pads 610. The saw line 506 may remove the connection between the inner contact pads 608 and the outer contact pads 610 after the package body 118 is molded in place.

A wire bond integrated circuit 612 may be mounted on the inactive surface of the base integrated circuit 602 by the adhesive 112. The electrical interconnects 114 may couple the wire bond integrated circuit 612 to the inner contact pads 608, the outer contact pads 610, the bond fingers 116, or a combination thereof. The heat spreader 508 may optionally be attached to the active side of the base integrated circuit 602 by a thermal adhesive 614.

Figure 7:
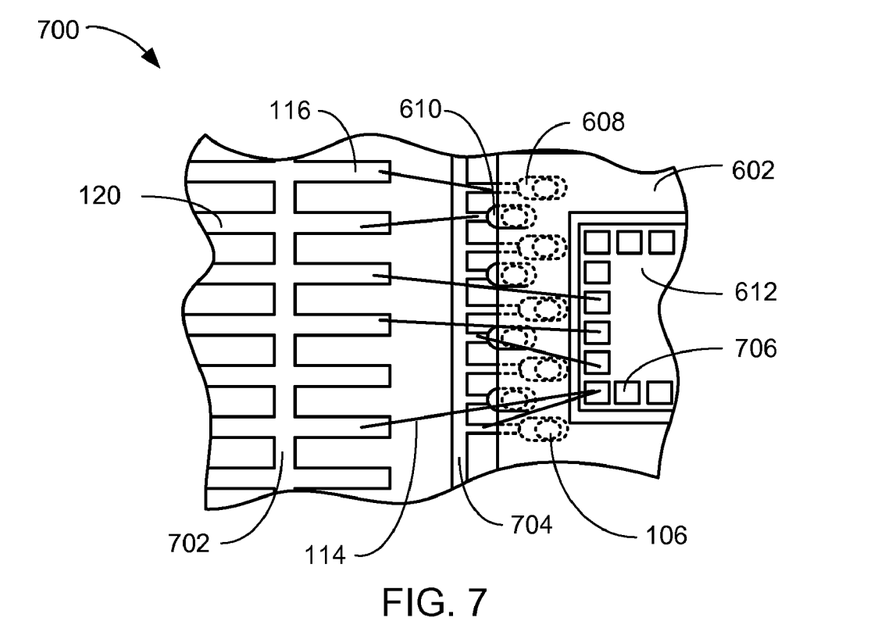
FIG. 7 is a top plan view of a lead frame assembly segment for implementing the integrated circuit packaging system of FIG. 5.

Referring now to FIG. 7, therein is shown a top plan view of a lead frame assembly 700 segment for implementing the integrated circuit packaging system 500 of FIG. 5. The top plan view of the lead frame assembly 700 depicts a dam bar 702 establishing the spatial position of the bond fingers 116 and the connection leads 120. A tie bar 704 may establish the spatial position of the inner contact pads 608 and the outer contact pads 610. The base integrated circuit 602 may be coupled to the inner contact pads 608 and the outer contact pads 610 by the chip interconnects 106.

The electrical interconnects 114 may be electrically connected to the inner contact pads 608, the outer contact pads 610, the bond finger 116, the wire bond integrated circuit 612, or a combination thereof. The position and size of the wire bond integrated circuit 612 is an example only and the actual size and position may differ. The number and position of bonding pads 706 on the wire bond integrated circuit 612 is also an example and may differ.

Figure 8:
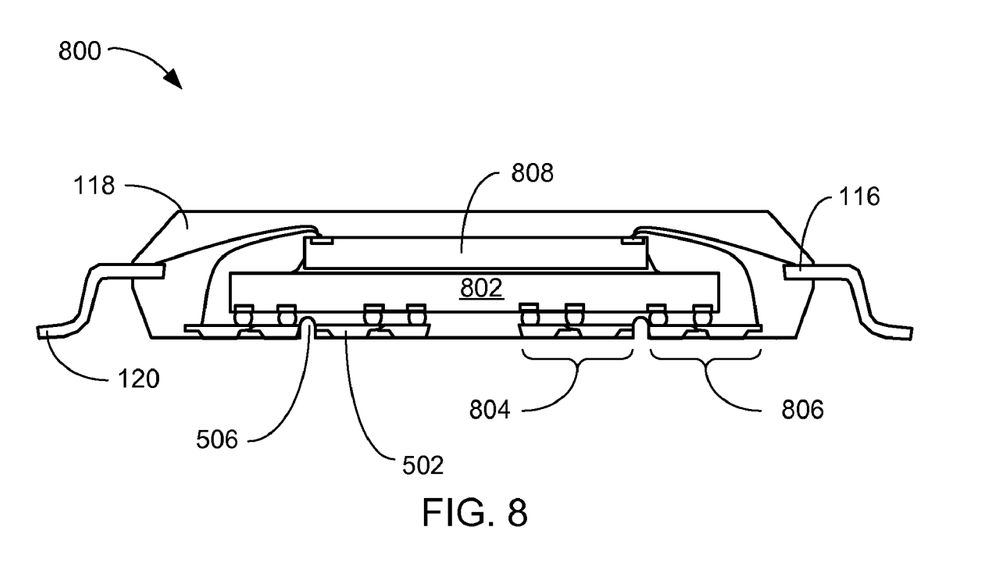
FIG. 8 is a cross-sectional view, substantially similar to FIG. 6, of an integrated circuit packaging system, in a third alternative embodiment of the present invention.

Referring now to FIG. 8, therein is shown a cross-sectional view, substantially similar to FIG. 6, of an integrated circuit packaging system 800, in a third alternative embodiment of the present invention. The cross-sectional view of the integrated circuit packaging system 800 is viewed along a section line substantially similar to the section line 6-6. A base integrated circuit 802, such as a flip chip integrated circuit, may be electrically connected to an inner lead group 804 and an outer lead group 806. The inner lead group 804 is limited to coupling the base integrated circuit 802 to the next level system (not shown) only. The outer lead group 806 in contrast may be coupled to a wire bond integrated circuit 808, the bond finger 116, or a combination thereof.

The connection leads 120 may be formed in order to provide a coplanar connection surface with the inner lead group 804 and the outer lead group 806. The package body 118 may be molded on the bond finger 116, the inner lead group 804 and the outer lead group 806 while leaving the bottom surface of the inner lead group 804 and the outer lead group 806 exposed for electrical connection.

The saw line 506 may be etched, by the singulating saw or the laser, in order to isolate the contact pads 502 that form the inner lead group 804 and the outer lead group 806. The base integrated circuit 802 may have any number of the contact pads coupled and may be configured with a different number than shown.

Figure 9:
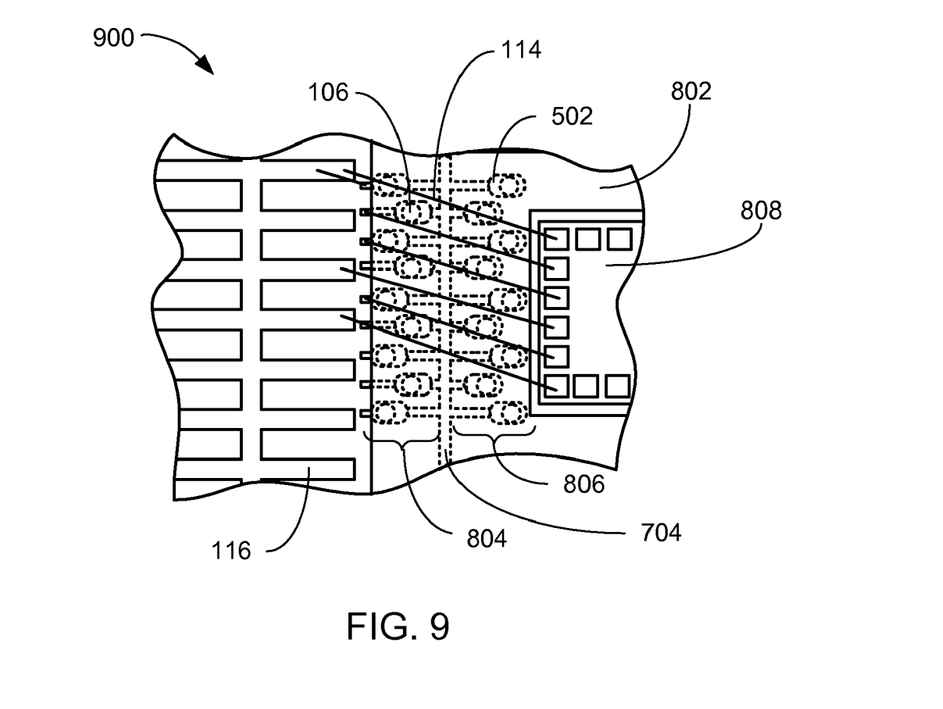
FIG. 9 is a top plan view of a lead frame assembly segment for implementing the integrated circuit packaging system of FIG. 8.

Referring now to FIG. 9, therein is shown a top plan view of a lead frame assembly 900 segment for implementing the integrated circuit packaging system of FIG. 8. The top plan view of the lead frame assembly 900 depicts the inner lead group 804 and the outer lead group 806 connected to the tie bar 704. The base integrated circuit 802 may be electrically connected to the contact pads 502 by the chip interconnects 106.

The electrical interconnects 114 may be coupled between the outer lead group 806, the wire bond integrated circuit 808, the bond finger 116, or a combination thereof. The number and position of the contact pads 502 in the inner lead group 804 and the outer lead group 806 is an example only and the number and position may differ. The size and position of the wire bond integrated circuit 808 is an example and may also differ.

Figure 10:
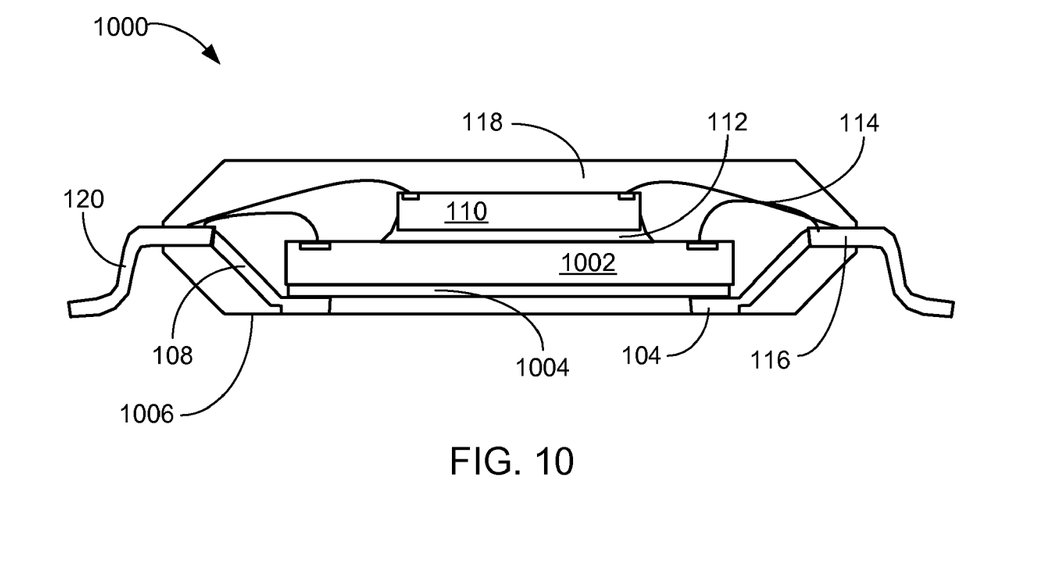
FIG. 10 is a cross-sectional view, substantially similar to FIG. 6, of an integrated circuit packaging system, in a fourth alternative embodiment of the present invention.

Referring now to FIG. 10, therein is shown a cross-sectional view, substantially similar to FIG. 6, of an integrated circuit packaging system 1000, in a fourth alternative embodiment of the present invention. The cross-sectional view of the integrated circuit packaging system 1000 depicts a base integrated circuit 1002, such as the wire bond integrated circuit, having a wafer backside coating 1004 mounted on the contact pads 104. The wafer backside coating 1004, such as an adhesive layer, may be applied to a wafer back side prior to singulating the base integrated circuit 1002. The base integrated circuit 1002 is coupled to the contact pads 104 by the electrical interconnects 114 coupled to the tie bar 108. The contact pads 104 may extend from the tie bar 108 that may elevate to a level near that of the top side of the base integrated circuit 1002.

The wire bond integrated circuit 110 may be attached to the top side of the base integrated circuit 1002 by the adhesive 112, such as a die attach material. The electrical interconnects 114, such as bond wires, may couple the wire bond integrated circuit 110 to a bond finger 116, the tie bar 108, or a combination thereof.

The package body 118 may be formed on the base integrated circuit 1002, the wire bond integrated circuit 110, the electrical interconnects 114, the tie bars 108, the bond fingers 116, and the contact pads 104.

The connection leads 120 may extend from the bond finger 116, beyond the package body 118, and are bent in a pattern suitable for attaching the integrated circuit packaging system 1000 to a next level system (not shown). The connection leads 120 are formed so that they are coplanar with the exposed portion of the contact pads 104 and a bottom surface 1006 of the package body 118.

Figure 11:
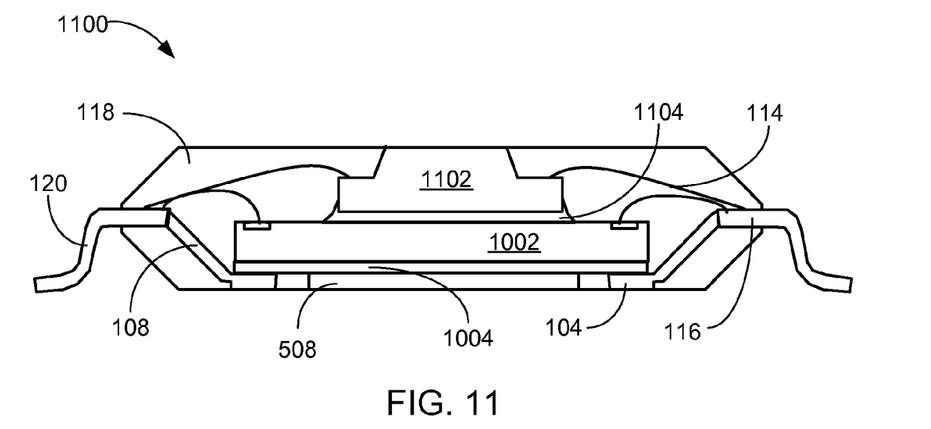
FIG. 11 is a cross-sectional view, substantially similar to FIG. 6, of an integrated circuit packaging system, in a fifth alternative embodiment of the present invention.

Referring now to FIG. 11, therein is shown a cross-sectional view, substantially similar to FIG. 6, of an integrated circuit packaging system 1100, in a fifth alternative embodiment of the present invention. The cross-sectional view of the integrated circuit packaging system 1100 depicts the base integrated circuit 1002, such as the wire bond integrated circuit having the wafer backside coating 1004 mounted on the contact pads 104. The wafer backside coating 1004, such as an adhesive layer, may be applied to the wafer back side prior to singulating the base integrated circuit 1002. The base integrated circuit 1002 is coupled to the contact pads 104 by the electrical interconnects 114 coupled to the tie bar 108. The contact pads 104 may extend from the tie bar 108 that may elevate to a level near that of the top side of the base integrated circuit 1002.

A stacked heat sink 1102 may be attached to the top side of the base integrated circuit 1002 by an adhesive 1104, such as a non-conductive epoxy. The electrical interconnects 114, such as bond wires, may optionally couple the stacked heat sink 1102 to a bond finger 116, the tie bar 108, or a combination thereof for applying a ground potential. The heat spreader 508 may optionally be embedded below the wafer backside coating 1004.

The package body 118 may be formed on the base integrated circuit 1002, the stacked heat sink 1102, the electrical interconnects 114, the tie bars 108, the bond fingers 116, and the contact pads 104.

The connection leads 120 may extend from the bond finger 116, beyond the package body 118, and are bent in a pattern suitable for attaching the integrated circuit packaging system 1000 to a next level system (not shown). The connection leads 120 are formed so that they are coplanar with the exposed portion of the contact pads 104 and the bottom of the package body 118.

Figure 12:
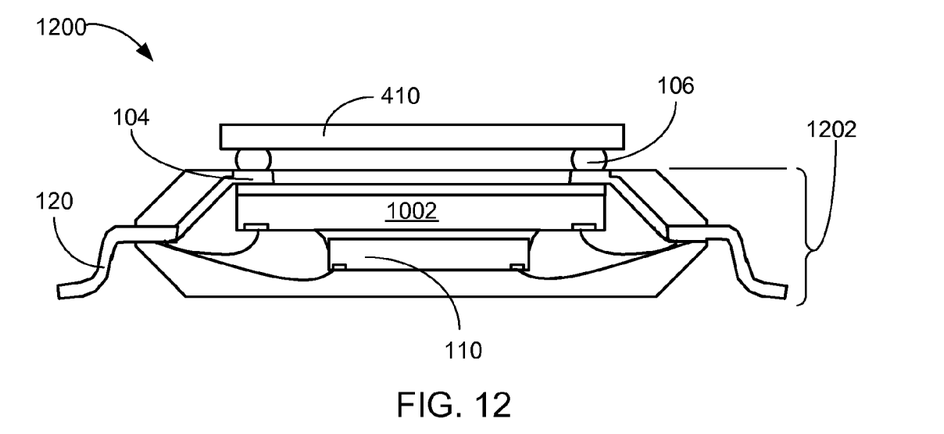
FIG. 12 is a cross-sectional view, substantially similar to FIG. 6, of a package stack application using an alternative embodiment of the integrated circuit packaging system, of FIG. 10.

Referring now to FIG. 12, therein is shown a cross-sectional view, substantially similar to FIG. 6, of a package stack 1200 application using an alternative embodiment of the integrated circuit packaging system 1000, of FIG. 10. The cross-sectional view of the package stack 1200 depicts the alternative embodiment 1202, having the connection leads 120 bent away from the plane of the contact pads 104.

The external integrated circuit package 410 may be coupled to the contact pads 104 by the chip interconnects 106. The external integrated circuit package 410 may be a ball grid array, a wafer level chip scale package, a quad flat pack, a quad flat pack—no lead (QFN), or other leaded chip carrier. This configuration provides electrical connections between the connection leads 120, the base integrated circuit 102, the wire bond integrated circuit 110, the external integrated circuit package 410, or a combination thereof.

Figure 13:
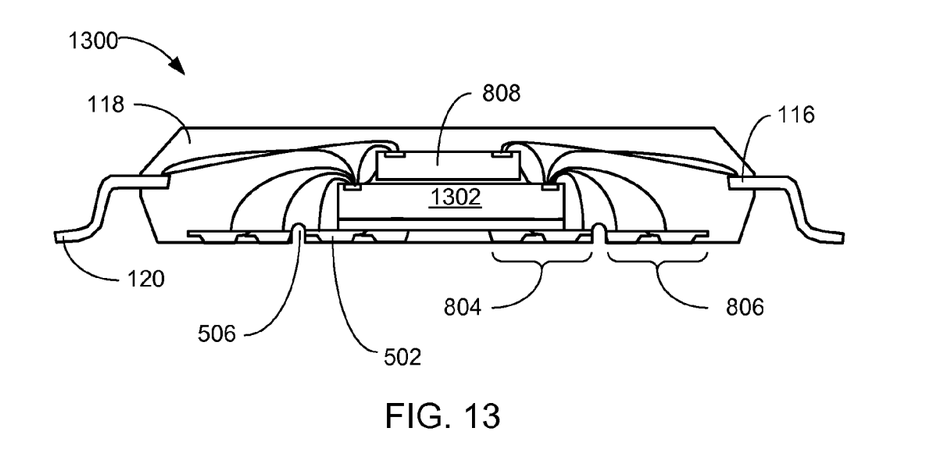
FIG. 13 is a cross-sectional view, substantially similar to FIG. 6, of an integrated circuit packaging system, in a sixth alternative embodiment of the present invention.

Referring now to FIG. 13, therein is shown a cross-sectional view, substantially similar to FIG. 6, of an integrated circuit packaging system 1300, in a sixth alternative embodiment of the present invention. The cross-sectional view of the integrated circuit packaging system 1300 is viewed along a section line substantially similar to the section line 6-6. A base integrated circuit 1302 may be electrically connected to the inner lead group 804 and the outer lead group 806. The inner lead group 804 is limited to coupling the base integrated circuit 1302 to the next level system (not shown) only. The outer lead group 806 in contrast may be coupled to a wire bond integrated circuit 808, the bond finger 116, or a combination thereof.

The connection leads 120 may be formed in order to provide a coplanar connection surface with the inner lead group 804 and the outer lead group 806. The package body 118 may be molded on the bond finger 116, the inner lead group 804 and the outer lead group 806 while leaving the bottom surface of the inner lead group 804 and the outer lead group 806 exposed for electrical connection.

The saw line 506 may be etched, by the singulating saw or the laser, in order to isolate the contact pads 502 that form the inner lead group 804 and the outer lead group 806. The base integrated circuit 1302 may have any number of the contact pads coupled and may be configured with a different number than shown.

Figure 14:
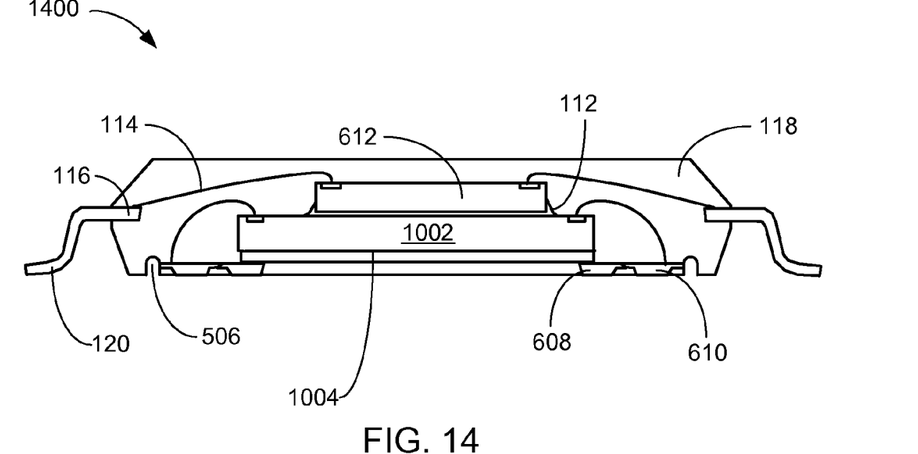
FIG. 14 is a cross-sectional view, substantially similar to FIG. 6, of an integrated circuit packaging system, in a seventh alternative embodiment of the present invention.

Referring now to FIG. 14, therein is shown a cross-sectional view, substantially similar to FIG. 6, of an integrated circuit packaging system 1400, in a seventh alternative embodiment of the present invention. The cross-sectional view of the integrated circuit packaging system 1400 depicts the base integrated circuit 1002 having the wafer backside coating 1004 positioned on the inner contact pads 608. The chip interconnects 106 may couple the inner pads 604 to inner contact pads 608 and the outer pads 606 to outer contact pads 610. The saw line 506 may remove the connection between the inner contact pads 608 and the outer contact pads 610 after the package body 118 is molded in place.

A wire bond integrated circuit 612 may be mounted on the base integrated circuit 1002 by the adhesive 112. The electrical interconnects 114 may couple the wire bond integrated circuit 612 to the inner contact pads 608, the outer contact pads 610, the bond fingers 116, or a combination thereof.

Figure 15:
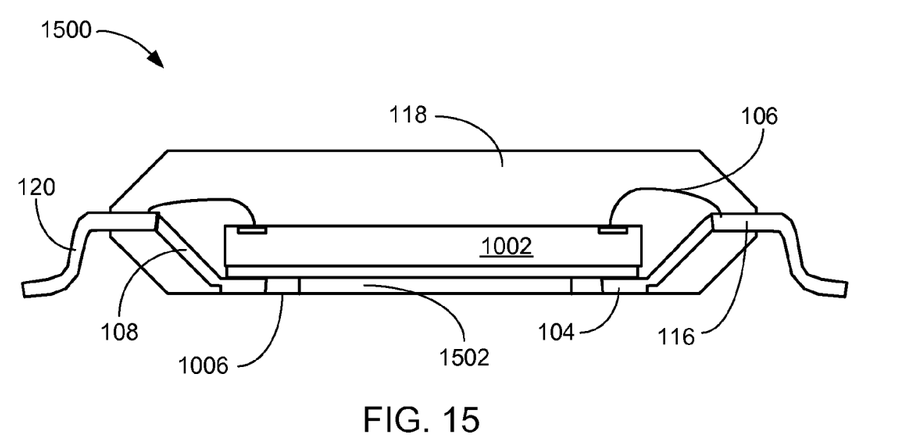
FIG. 15 is a cross-sectional view, substantially similar to FIG. 6, of an integrated circuit packaging system, in an eighth alternative embodiment of the present invention.

Referring now to FIG. 15, therein is shown a cross-sectional view, substantially similar to FIG. 6, of an integrated circuit packaging system 1500, in an eighth alternative embodiment of the present invention. The cross-sectional view of the integrated circuit packaging system 1500 depicts the base integrated circuit 1002, such as the wire bond integrated circuit, having the wafer backside coating 1004 mounted on the contact pads 104. The wafer backside coating 1004, such as an adhesive layer, may be applied to the wafer back side prior to singulating the base integrated circuit 1002. The base integrated circuit 1002 is coupled to the contact pads 104 by the chip interconnects 106 coupled to the tie bar 108. The contact pads 104 may extend from the tie bar 108 that may elevate to a level near that of the top side of the base integrated circuit 1002.

The package body 118 may be formed on the base integrated circuit 1002, the chip interconnects 106, the tie bars 108, the bond fingers 116, and the contact pads 104. The connection leads 120 may extend from the bond finger 116, beyond the package body 118, and are bent in a pattern suitable for attaching the integrated circuit packaging system 1500 to a next level system (not shown). The connection leads 120 are formed so that they are coplanar with the exposed portion of the contact pads 104 and the bottom surface 1006 of the package body 118. A heat spreader 1502 may optionally be attached in the package bottom.

Figure 16:
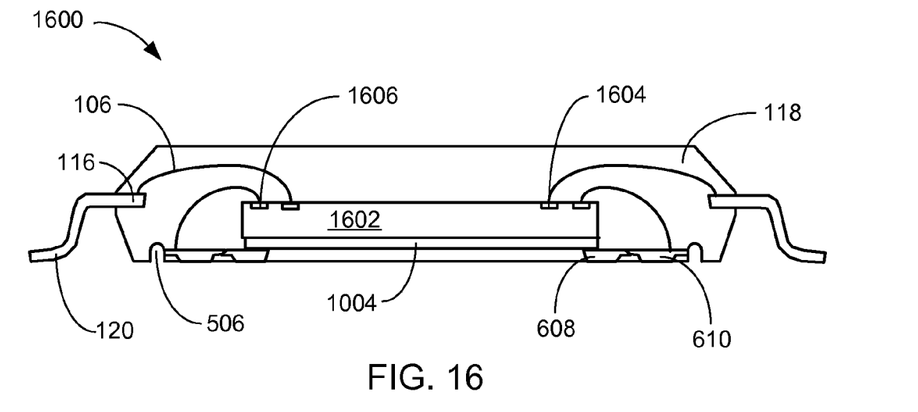
FIG. 16 is a cross-sectional view, substantially similar to FIG. 6, of an integrated circuit packaging system, in a ninth alternative embodiment of the present invention.

Referring now to FIG. 16, therein is shown a cross-sectional view, substantially similar to FIG. 6, of an integrated circuit packaging system 1600, in a ninth alternative embodiment of the present invention. The cross-sectional view of the integrated circuit packaging system 1600 depicts the base integrated circuit 1602 having the wafer backside coating 1004 positioned on the inner contact pads 608.

The chip interconnects 106 may couple inner bond pads 1604 to the bond finger 116 and outer bond pads 1606 to the inner contact pads 608 or the outer contact pads 610. The saw line 506 may remove the connection between the inner contact pads 608 and the outer contact pads 610 after the package body 118 is molded in place. The chip interconnects 106 may couple the base integrated circuit 1602 to the inner contact pads 608, the outer contact pads 610, the bond fingers 116, or a combination thereof.

Figure 17:
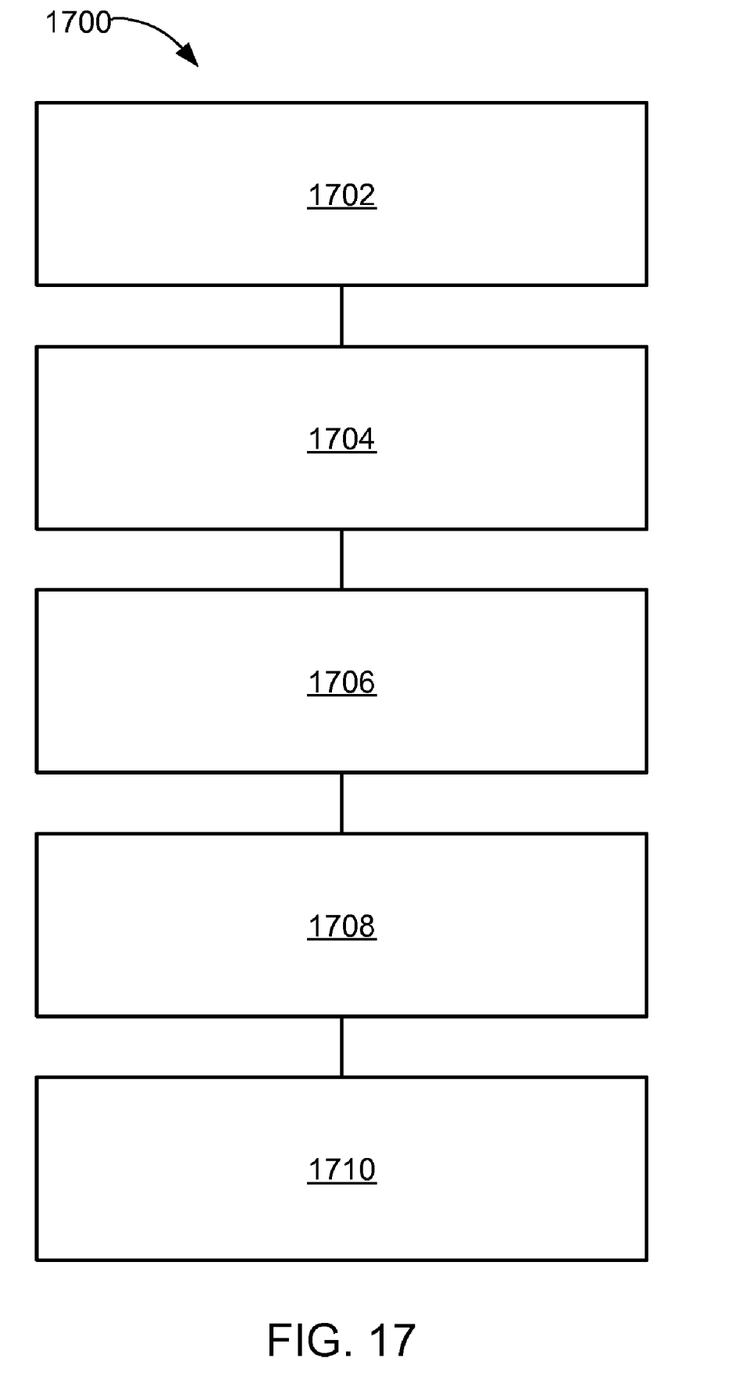
FIG. 17 is a flow chart of a method of manufacture of an integrated circuit packaging system in an embodiment of the present invention.

Referring now to FIG. 17, therein is shown a flow chart of a method of manufacture of an integrated circuit packaging system 100 in an embodiment of the present invention. The method 1700 includes forming a lead frame having contact pads and connection leads in a block 1702; coupling a base integrated circuit to the contact pads in a block 1704; coupling a chip interconnect between the base integrated circuit, the connection leads, the contact pads, or a combination thereof in a block 1706; molding a package body, on the lead frame, the base integrated circuit, and the chip interconnects, includes having the contact pads exposed in a block 1708; and forming a bottom surface on the package body including forming the connection leads to be coplanar with the bottom surface in a block 1710.

An aspect that has been unexpectedly discovered is that the present invention may simplify the design of the next level system, such as a printed circuit board, by reducing the number of electrical connections required outside the integrated circuit packaging system.

Another aspect is the overall package thickness may be reduced because no internal substrate is required while mounting the wire bond integrated circuit.

Yet another important aspect of the present invention is that it valuably supports and services the historical trend of reducing costs, simplifying systems, and increasing performance.

These and other valuable aspects of the present invention consequently further the state of the technology to at least the next level.

Thus, it has been discovered that the integrated circuit packaging system with increased connectivity of the present invention furnishes important and heretofore unknown and unavailable solutions, capabilities, and functional aspects for higher levels of integration in integrated circuit packages with leaded configurations. The resulting processes and configurations are straightforward, cost-effective, uncomplicated, highly versatile and effective, can be surprisingly and unobviously implemented by adapting known technologies, and are thus readily suited for efficiently and economically manufacturing integrated circuit devices fully compatible with conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. An integrated circuit packaging system comprising:
   a package body, having contact pads adjacent a saw line and connection leads exposed;
   a base integrated circuit coupled to the contact pads;
   chip interconnects between the base integrated circuit, the connection leads, the contact pads, or a combination thereof; and
   a bottom surface on the package body with the connection leads formed coplanar to the bottom surface.

2. The system as claimed in claim 1 wherein the package body having the contact pads includes inner contact pads and outer contact pads exposed on the package body.

3. The system as claimed in claim 1 further comprising a heat spreader coupled to the base integrated circuit.

4. The system as claimed in claim 1 further comprises:
   an adhesive on the base integrated circuit; and
   a bond pad on the base integrated circuit, a bond finger on the connection leads, the contact pads, or a combination thereof coupled by the chip interconnects.

5. The system as claimed in claim 4 wherein the package body having the contact pads includes inner contact pads and outer contact pads exposed on the package body including an inner lead group and an outer lead group formed with the inner contact pads and the outer contact pads in each.

6. The system as claimed in claim 4 further comprising a heat spreader coupled to the base integrated circuit includes a thermal adhesive between the heat spreader and the base integrated circuit.

7. The system as claimed in claim 4 wherein the package body includes a saw line adjacent to the contact pads, the saw line formed between an inner lead group and an outer lead group.

* * * * *